US012607683B2

(12) United States Patent
Deinzer et al.

(10) Patent No.: US 12,607,683 B2
(45) Date of Patent: Apr. 21, 2026

(54) METHOD AND APPARATUS FOR MONITORING A LOW-PASS FILTER, BATTERY MANAGEMENT SYSTEM, BATTERY AND VEHICLE

(71) Applicant: HELLA GmbH & Co. KGaA, Lippstadt (DE)

(72) Inventors: Rudolf Deinzer, Neumarkt (DE); Tomasz Efner, Wolczkowo (PL); Andreas Ernst, Bovenden (DE)

(73) Assignee: Hella GmbH & Co. KGaA, Lippstadt (DE)

( * ) Notice: Subject to any disclaimer, the term of this patent is extended or adjusted under 35 U.S.C. 154(b) by 668 days.

(21) Appl. No.: 18/093,621

(22) Filed: Jan. 5, 2023

(65) Prior Publication Data

US 2023/0142540 A1 May 11, 2023

Related U.S. Application Data

(63) Continuation of application No. PCT/EP2021/067666, filed on Jun. 28, 2021.

(30) Foreign Application Priority Data

Jul. 6, 2020 (DE) ..................... 10 2020 117 744.5

(51) Int. Cl.
*G01R 31/3842* (2019.01)
*G01R 31/367* (2019.01)
*H02J 7/00* (2006.01)

(52) U.S. Cl.
CPC ....... *G01R 31/3842* (2019.01); *G01R 31/367* (2019.01); *H02J 7/0068* (2013.01)

(58) Field of Classification Search
CPC ............. G01R 31/3842; G01R 31/367; G01R 31/389; G01R 31/016; H02J 7/0068
(Continued)

(56) References Cited

U.S. PATENT DOCUMENTS

| | | | | |
|---|---|---|---|---|
| 2,765,442 A | * | 10/1956 | Logan | G01R 19/04 |
| | | | | 324/123 R |
| 6,506,153 B1 | * | 1/2003 | Littek | H10N 30/302 |
| | | | | 600/501 |

(Continued)

FOREIGN PATENT DOCUMENTS

| | | |
|---|---|---|
| DE | 112010002675 T5 | 11/2012 |
| DE | 102016215486 A1 | 2/2017 |

(Continued)

OTHER PUBLICATIONS

International Search Report dated Nov. 11, 2021 in corresponding application PCT/EP2021/067666.

*Primary Examiner* — M Baye Diao

(74) *Attorney, Agent, or Firm* — Muncy, Geissler, Olds & Lowe, P.C.

(57) ABSTRACT

A method and an apparatus for monitoring a low-pass filter, preferably a capacitor in a low-pass filter, a battery management system and a battery are provided. The apparatus includes a switch connected in series with a resistor, and a capacitor connected in parallel with the resistor. When the switch carries out a switching operation, the voltage changes within a very short time from a first to a second voltage value. A voltage detection device measures the voltage during switching and at at least one further point in time, 0.5 to 5 milliseconds later. Determining the speed at which the voltage changes from the first voltage value to the second voltage value makes it possible to determine whether the capacitor is functional and/or makes it possible to determine the resistance. Determining the internal resistance of a battery cell also makes it possible to determine the state of charge of a battery.

13 Claims, 4 Drawing Sheets

(58) Field of Classification Search

USPC .......................................................... 320/108

See application file for complete search history.

(56) References Cited

U.S. PATENT DOCUMENTS

| | | | | |
|---|---|---|---|---|
| 6,713,894 | B1 * | 3/2004 | Reimer | H02J 7/345 |
| | | | | 307/10.1 |
| 6,998,906 | B1 * | 2/2006 | Cook | H03K 5/1252 |
| | | | | 327/551 |
| 8,362,784 | B2 | 1/2013 | Takeuchi | |
| 10,020,661 | B2 | 7/2018 | Fujii et al. | |
| 10,042,005 | B2 * | 8/2018 | Syouda | B60L 58/10 |
| 10,063,071 | B2 * | 8/2018 | Biskup | H02J 7/0025 |
| 10,067,193 | B2 * | 9/2018 | Cois | H01M 10/44 |
| 11,853,044 | B2 * | 12/2023 | Wang | G01R 31/374 |
| 2004/0174170 | A1 * | 9/2004 | Kim | G01R 19/16542 |
| | | | | 324/426 |
| 2009/0115538 | A1 * | 5/2009 | Gaede | H03L 1/022 |
| | | | | 331/1 R |
| 2011/0309803 | A1 * | 12/2011 | Fitzi | H10N 30/802 |
| | | | | 310/314 |
| 2012/0153966 | A1 * | 6/2012 | Kawamura | G01R 31/64 |
| | | | | 324/548 |
| 2014/0266050 | A1 * | 9/2014 | Biskup | H02J 7/0048 |
| | | | | 320/136 |
| 2020/0124677 | A1 * | 4/2020 | Enmei | G01R 31/396 |
| 2022/0311065 | A1 | 9/2022 | Zeidler et al. | |

FOREIGN PATENT DOCUMENTS

| | | | |
|---|---|---|---|
| EP | 2899835 | A1 | 7/2015 |
| WO | WO2021122368 | A1 | 6/2021 |

\* cited by examiner

METHOD AND APPARATUS FOR MONITORING A LOW-PASS FILTER, BATTERY MANAGEMENT SYSTEM, BATTERY AND VEHICLE

This nonprovisional application is a continuation of International Application No. PCT/EP2021/067666, which was filed on Jun. 28, 2021, and which claims priority to German Patent Application No. 10 2020 117 744.5, which was filed in Germany on Jul. 6, 2020, and which are both herein incorporated by reference.

BACKGROUND OF THE INVENTION

Field of the Invention

The present invention relates to a method and to an apparatus for monitoring a low-pass filter. The invention also relates to a battery management system and to a battery having such a battery management system. Lastly, the invention relates to a vehicle.

Description of the Background Art

Batteries, in particular batteries based on lithium-ion technology, usually have a battery management system. As a rule, battery management systems are used to monitor the battery and to control the charging and discharging processes of the associated battery.

Because battery management systems are themselves functionally relevant in many applications, especially in vehicles, it is advantageous to monitor the function of at least parts of the battery management system itself for functionality.

Often, battery management systems comprise low-pass filters to monitor the battery for malfunction in a simplified manner.

SUMMARY OF THE INVENTION

It is therefore an object of the present invention to monitor such a malfunction in a simplified manner.

In the method for monitoring a low-pass filter, the low-pass filter comprises at least one resistor and at least one capacitor, the capacitor being connected in parallel with the resistor, wherein the voltage is determined with respect to one side of the capacitor, wherein the voltage at the capacitor is switchable by at least one switch between a first setpoint voltage value and a second setpoint voltage value, wherein the method comprises at least the following steps: detecting the first actual voltage value at a first point in time; a switching operation from the first setpoint voltage value to the second setpoint voltage value; detecting the actual voltage value at a second point in time, wherein the second point in time is arranged temporally after the switching operation; determining a first difference of the respective actual voltage values; and providing a warning signal if at least the first difference exceeds or falls below a first threshold.

A low-pass filter can be understood here as, for example, an RC element.

A variable resistor such as a temperature-dependent resistor can be used as the resistor. A resistance value can correspond to a measured quantity such as a temperature of a battery cell, a temperature of a battery, a state of charge of a battery cell, and/or a state of charge of a battery having a plurality of battery cells.

The switching operation can be performed by switching a switch, wherein the switch is advantageously integrated into an integrated circuit, in particular an ASIC module.

The capacitor can have a capacitance and is designed, for example, as a film capacitor. Here the terms capacitor and capacitance are used synonymously. The capacitor is used, for example, to suppress interference in a circuit such as a device for monitoring a battery cell or a battery. The capacitor advantageously conducts interference voltages, changing rapidly over time, to ground largely unimpeded and thus serves to improve the stability of the apparatus for monitoring. In a defective state, the capacitor is not conductive.

The actual voltage values may be detected with the aid of a voltage detection unit. The voltage detection device is preferably connected in series with the variable resistor. The voltage detection device is preferably used to determine the voltage applied at the capacitor.

A further resistor can be assigned to the variable resistor, wherein the two resistors are preferably each connected in series with the voltage detection device.

Advantageously, the actual voltage values can be determined at time-periodic intervals. Advantageously, the first point in time is set at the switching operation or shortly before the switching operation. As an example, the first point in time is set to be 0.01 milliseconds to 0.1 milliseconds before the switching operation.

Advantageously, switching operations can occur every 10 milliseconds, so that a determination of the time constant can be made within a few milliseconds.

Advantageously, the second point in time can be set in this way when the voltage has increased/decreased by a certain factor with a properly functioning low-pass filter. Particularly preferably, a second point in time is set to occur one time constant after the switching operation, wherein the time constant is proportional to the product of the resistance and the capacitance of the capacitor.

The second point in time can also be set in a time range of 0.5 to 1.5 times the value of the time constant.

Alternatively, the second point in time can be set so that, with a functional low-pass filter, the voltage has risen/dropped to about half the difference between the two setpoint voltage values.

Accordingly, the first threshold can be selected as one-fourth and/or three-fourths of the difference in the voltage values.

The warning signal can be in the form of an acoustic signal or a light signal so that an inspection of the capacitor, the low-pass filter, or the system with the low-pass filter can be carried out. Preferably, the warning signal is provided as a voltage signal, for example, as a TTL signal, so that a central monitoring system can then be activated.

A low-pass filter can be monitored in a very simple manner with the invention with the aid of simple monitoring of voltage values. In particular, the functionality of a capacitor is easily possible with the help of the invention. Furthermore, other system variables can be monitored easily and efficiently using the method described above.

In an advantageous embodiment of the invention, a time constant, in particular a voltage rise or a voltage drop, can be determined on the basis of the difference, wherein the state of the resistor and/or the capacitor can be determined on the basis of the time constant.

For a low-pass filter considered here, the voltage usually changes increasing/decreasing exponentially with a time constant. The time constant is advantageously the product of the resistance and the capacitance of the capacitor.

Because the exponential rise or exponential drop in the voltage is known for the low-pass filter, a conclusion can be drawn on the functional testing of the resistor and/or the capacitor from the experimentally determined time constant.

The time constant is advantageously comparable to the product of the resistance and the capacitance. Thus, with a known capacitance, the resistance can be determined easily and with high accuracy.

The time constant can be used to easily determine the value of a variable resistance and/or capacitance.

The first point in time can be set to be immediately before the switching operation, wherein the second point in time is set to be one time constant after the switching operation.

Advantageously, a third point in time can be set to be two time constants after the switching operation.

The first point in time can optionally also be selected as shortly after the switching operation or as the point in time of the switching operation. The switching operation advantageously triggers the voltage detection unit, so that the voltage detection unit detects the first voltage value during the switching operation.

The second point in time can be selected as shortly after the switching operation; at commonly selected values for a capacitance and a resistance, a value of about 0.01 milliseconds to 1 millisecond is advantageously selected.

The second point in time can be selected such that the difference between the first voltage value and the second voltage value corresponds to approximately half the maximum difference. The maximum difference corresponds to the difference in voltage values which would occur with a defective, nonconductive capacitor. In other words, the maximum difference corresponds approximately to the difference between the first setpoint voltage value and the second setpoint voltage value.

A particularly reliable testing of the low-pass filter or a particularly reliable testing of the capacitor can occur by the advantageous selection of the points in time.

The resistor can be a variable resistor. The variable resistor can be advantageously used to determine a temperature, for example, the temperature of a battery or the temperature of at least one battery cell.

The resistor can be formed advantageously as an NTC or PTC resistor.

The variable resistor can be designed such that the change in resistance over time occurs considerably more slowly than the switching operation. Thus, the change in temperature is not filtered out by the low-pass filter.

By using a variable resistor, a particularly precise determination of the respective system variable, such as, for example, temperature as a function of time, can be made.

A third actual voltage value can be additionally determined at a third point in time, wherein the third point in time is set to be after the second point in time, wherein a first difference between the first actual voltage value and the second actual voltage value is determined, wherein a second difference between the second actual voltage value and the third actual voltage value is determined, and/or wherein the warning signal is provided when the first difference and the second difference each fall below or exceed the threshold.

Advantageously, the third point in time can be set in time after twice the time constant after the switching operation.

The third voltage value can be determined in a time range of 1 to 1.5 milliseconds after the switching operation, depending on the capacitance and resistance. Alternatively, the third point in time is between 0.5 and 1.5 times the time constant, preferably one time constant after the second point in time.

The second and third voltage values can be detected using the voltage detection unit. Preferably, the respective triggering of the detection of the voltage values is done by the switching operation.

Optionally, the detection of the respective voltage signal also occurs due to a trigger signal, which is used to trigger the switching operation and/or the voltage detection unit.

By capturing two voltage values at a second and a third point in time after the switching operation: a possibly occurring error during the detection of the second voltage value can be detected, an improved determination of the respective time constant can occur, as well as an increased operational reliability in the monitoring the low-pass filter can be achieved.

The resistance can be an internal resistance of a battery cell.

Advantageously, the resistance can be the internal resistance of a battery cell or a plurality of battery cells.

The design of the method can be based on the observation that the state of charge (SOC) can be inferred from a determination of the internal resistance of the battery cell.

Because the state of charge of the at least one battery cell changes only slowly and thus the resistance is changed only slowly, the state of charge of the at least one battery cell can be determined with the aid of the method described here.

Advantageously, the determination of the respective difference is carried out with the aid of the voltage detection device, wherein the at least one battery cell is discharged for a time period, as an example, of 1 to 10 milliseconds, preferably 2 milliseconds, via a further resistor and a switch. The further resistor is connected here in parallel with the at least one battery cell. The switch is advantageously connected in series with the resistor. Advantageously, at least one capacitor is connected to one terminal each of the at least one battery cell and a ground connection.

An advantageous method for testing a state of charge of at least one battery cell can be performed with an apparatus having: at least one battery cell, wherein the voltage is tapped at a positive terminal of the respective battery cell and a negative terminal of the battery cell, wherein a switch connects the positive terminal and the negative terminal via a resistor, wherein a capacitor is connected in parallel with the resistor, and wherein the method can include: detecting the first voltage value at a first point in time; a switching operation so that a connection is made between the positive terminal and the negative terminal of the respective battery cell; detecting the second voltage value at a second point in time; optionally, detecting a third voltage value at a third point in time; determining a first difference and optionally a second difference; determining the state of charge of the respective battery cell; and/or providing a warning signal if the respective difference is above a predefinable threshold.

The example described above can advantageously be used to determine both the function of a low-pass filter or a capacitor and the state of charge of a battery cell.

The testing can be performed during the charging process of a battery cell, wherein the first voltage value is detected before the charging process of the battery cell and the second voltage value is detected during the charging process of the battery cell and/or wherein the first voltage value is detected during the charging process of the battery cell and the second voltage value is detected after the charging process of the battery cell.

With the aid of the above example, both the state of charge of the respective battery cell and the function of the low-pass filter can be tested or monitored.

By regularly monitoring the low-pass filter, for example, one test per hour, the state of the respective battery cell can also be monitored.

A further switching operation can take place after the second period in time, wherein the further switching operation switches the voltage from the second setpoint voltage value to the first setpoint voltage value, wherein after the further switching operation a detection of the respective voltage value takes place, and wherein the respective difference is determined from the respective actual voltage values.

The further switching operation can take place 5 to 15 milliseconds after the switching operation.

The above-described method can repeat in a periodic manner, so that the setpoint voltage values are periodically switched back and forth between the first setpoint voltage value and the second setpoint voltage value. The testing of the low-pass filter can take place after the respective switching operation.

Advantageously, the first switching operation and the further switching operation are repeated periodically.

By regularly testing the low-pass filter, defects in the battery or the battery management system can be detected at an early stage.

The determination of the voltage values can take place during a functional test of a battery management system or a voltage detection unit, in particular during an end-of-line test.

Preferably, the method can be carried out during or after an assembly of the apparatus comprising the low-pass filter.

By testing the resistor and/or the function of the capacitor, the function of the apparatus can be tested in a particularly simple way. Particularly advantageously, the monitoring or testing of the low-pass filter or capacitor took place for the first time after completion of the apparatus. This type of testing, directly after completion, is also called an end-of-line test. Particularly advantageously, a method described here can be carried out in addition to or instead of a so-called in-circuit test.

Particularly advantageously, the voltage values can be determined with the aid of a controller of the apparatus, as an example, designed as an ASIC module. Advantageously, the switching operation and the detection of the voltage values as well as the triggering of the at least one switching operation and/or the triggering of the voltage detection device advantageously take place with the aid of the ASIC module.

By starting the method for the first time after the apparatus is completed, some of the usual end-of-line tests can be automated. In particular, the functional reliability of the apparatus can be increased thereby.

The low-pass filter can be associated with at least one battery cell, the apparatus can include a low-pass filter with a capacitor and a resistor and at least one switch, a voltage detection unit being designed for determining the voltage values at the capacitor.

The apparatus can be integrated into or associated with a battery management system.

The apparatus can have an ASIC module, wherein the ASIC module comprises the at least one switch and the voltage detection unit.

Such an ASIC module is particularly advantageously already present in a battery management system. In such a case, the already present ASIC module of the battery management system can be used.

The ASIC can comprise the respective switch, wherein the respective switch is designed to perform the switching operation.

The ASIC can be further configured to provide a reference voltage. The reference voltage can be the first setpoint voltage value or the second setpoint voltage value. The reference voltage can also be provided by a voltage divider, wherein the voltage divider is arranged between the ASIC module and the low-pass filter, in particular the capacitor. The voltage divider can also be integrated into the low-pass filter.

The battery management system for at least one battery cell can have an apparatus described above.

A battery cell can be understood to be, for example, a single battery cell or also a plurality of battery cells connected in series and/or in parallel.

Advantageously, the battery management system can include the ASIC module, wherein the method described above is carried out with the aid of the ASIC module.

Alternatively, or in addition, the battery management system can be configured to monitor the capacitor and/or the resistor in accordance with the method set forth above.

The battery, in particular designed for use in a vehicle, can comprise the battery management system.

For example, the battery can be designed as a dual-voltage battery, as an example, for 12 volts and 48 volts. Alternatively, the battery is designed as a high-voltage battery, preferably a battery with an output voltage of 400 volts to 1000 volts.

The vehicle can be designed as an automobile, for example, as an at least partially electrically driven automobile. Alternatively, the vehicle can be a rail vehicle, or any type of electric or hybrid vehicle.

The apparatus and method can be used to monitor a resistor, in particular a variable resistor, and a capacitor or capacitance, each being part of a low-pass filter, for a malfunction. In addition, if the low-pass filter is functional, the method can monitor the state of charge via the internal resistance of a battery or battery cell.

In summary, the invention relates to a method and an apparatus for monitoring a low-pass filter, preferably a capacitor in a low-pass filter. The invention also relates to a battery management system and to a battery having such a battery management system. The apparatus comprises a switch, the switch being connected in series with a resistor, and a capacitor, the capacitor being connected in parallel with the resistor. Provided that the switch carries out a switching operation, the voltage changes within a very short time from a first voltage value to a second voltage value. In this case, the capacitor is used to slow down the voltage rise/voltage drop. A voltage detection device is used to measure the voltage during switching and at at least one further point in time, 0.5 to 5 milliseconds later, depending on the resistance and capacitance. Determining the speed at which the voltage changes from the first voltage value to the second voltage value makes it possible to determine whether the capacitor is functional and/or makes it possible to determine the resistance. Determining the internal resistance of a battery cell also makes it possible to determine the state of charge of a battery Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
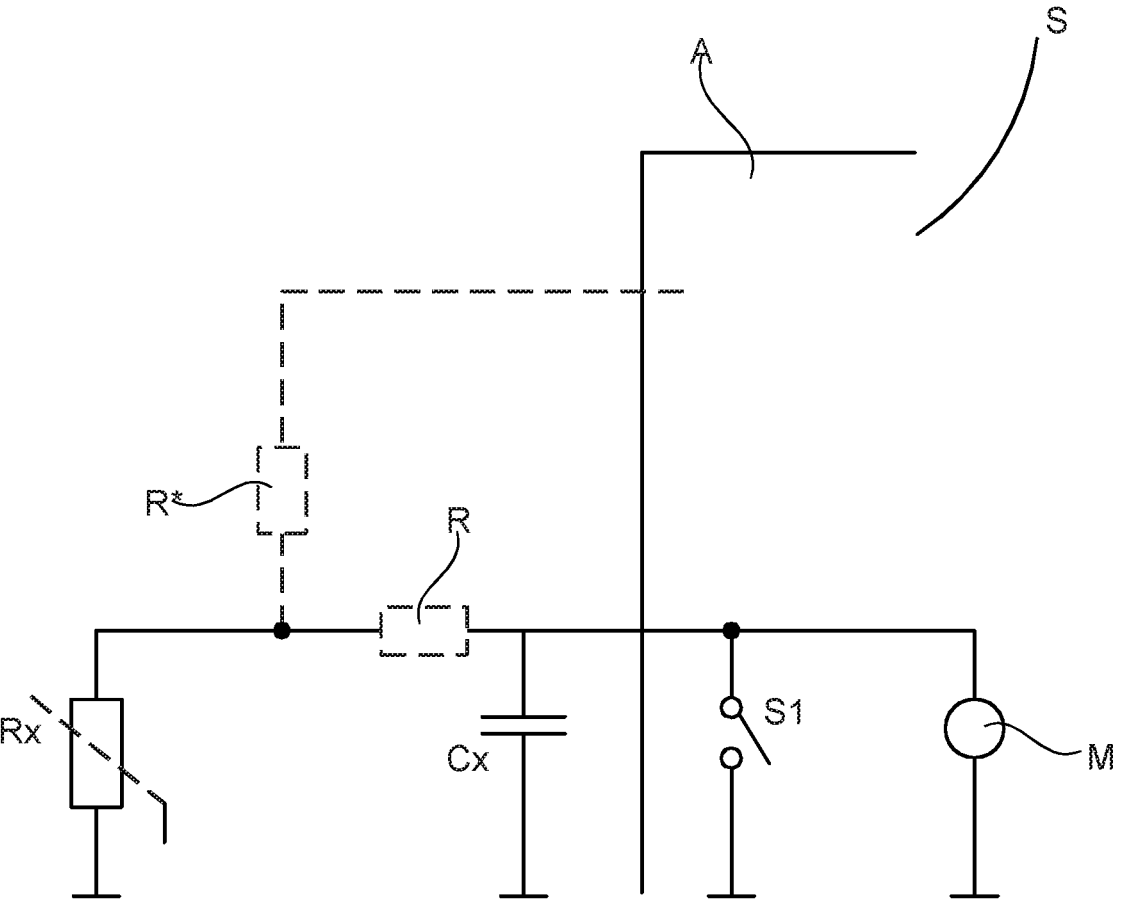
FIG. 1 shows an exemplary apparatus.

FIG. 1 shows an exemplary apparatus. The apparatus comprises a capacitor Cx having a capacitance, wherein the capacitor Cx with a variable resistor Rx forms a low-pass filter. The variable resistor is preferably designed as a temperature-dependent resistor, in particular as an NTC (negative temperature coefficient thermistor). Resistor Rx is preferably used to determine a temperature of a battery cell B1 or a battery.

A voltage U is applied to the capacitance of capacitor Cx and resistor Rx. The voltage U can be a reference voltage u-ref, wherein the reference voltage u-ref can be provided by a voltage divider, as the resistor R* shown by the dashed lines shows. Particularly advantageously, the reference voltage u-ref can be provided by an ASIC module A.

With a switch S1 the voltage U can be switched to ground or to a second setpoint voltage value u2. By changing the voltage U, the low-pass filter becomes active. Provided that capacitor Cx is functional, the voltage U across capacitor Cx does not drop immediately, but capacitor Cx is discharged via variable resistor Rx. This slowed-down drop in voltage U can be detected with voltage detection unit M. Voltage detection unit M is advantageously connected in parallel with capacitor Cx.

Preferably, an ASIC module A serves as the voltage source. The ASIC module A preferably also comprises voltage detection unit M and switch S1.

Optionally, a further resistor R can be connected between capacitor Cx and variable resistor Rx With a functional capacitance Cx, after a closing of switch S1, a part of the electric charge will flow through variable resistor Rx, so that the voltage U decreases more slowly. By detecting the voltage U as a function of time t, in particular at a first point in time t1, at a second point in time t2, and optionally still at a third point in time t3, the voltage drop can be determined, in particular on the basis of voltage differences diff1, diff2.

The voltage detection unit M can be used in particular to check whether capacitor Cx is functional. In general, a nonfunctional capacitor Cx has an infinite resistance instead of a capacitive resistance for a nonconstant voltage; i.e., it behaves analogously to an interrupted line. Accordingly, the voltage U would drop to zero volts or to the second setpoint voltage value within a very short time t. At a first point in time t1, the voltage U would have already dropped to zero volts or to the second setpoint voltage value. At the second point in time t2 and at the third point in time, the voltage across capacitor Cx would be at the second setpoint voltage value u2 or at zero volts.

The difference between the first actual voltage value u1 and the second actual voltage value u2 would therefore be the difference between the setpoint voltage values. As a rule, a threshold is specified which has a value below the difference of the setpoint voltage values. Accordingly, a warning signal S would be output in the event of a defective capacitor Cx or a defective resistor Rx.

Figure 2:
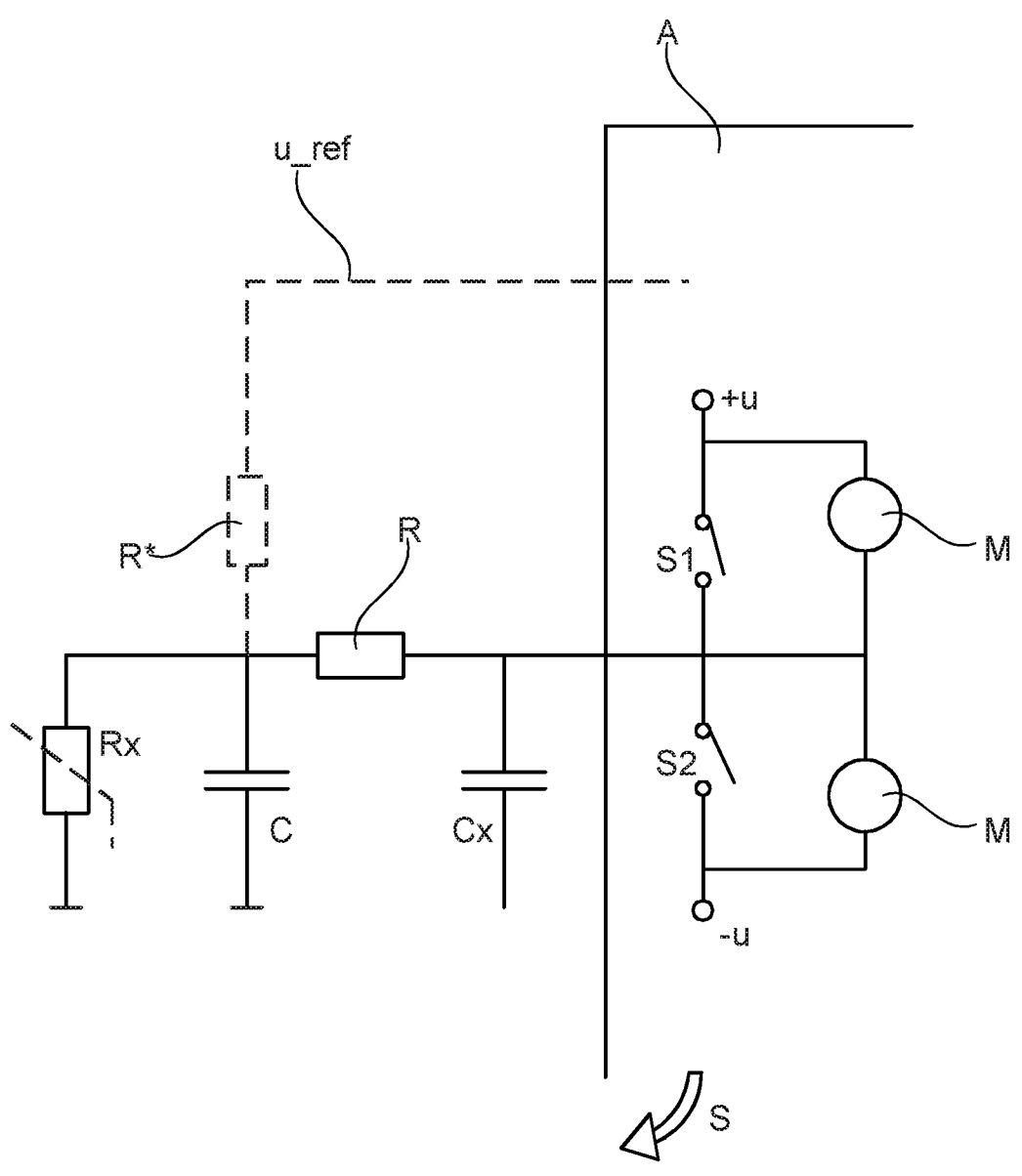
FIG. 2 shows an exemplary apparatus.

FIG. 2 shows a further exemplary apparatus. The apparatus shown here differs from the device described above in that, in addition to variable resistor Rx, a further resistor R is connected between variable resistor Rx and the respective switch S1, S2. To provide a setpoint voltage value u1, u2, a first switch S1 and a second switch S2 are provided according to the embodiment shown here. By means of the respective switch S1, S2, the voltage U can be switched to a positive setpoint voltage value +U or a negative setpoint voltage value −U.

Moreover, the possible embodiment comprises a further capacitor C, which is connected in parallel with capacitor Cx. Preferably, the further capacitor C has a capacitance C that is different from capacitor Cx, so that it can be checked which of the capacitors Cx, C is defective with the aid of the embodiment shown here.

Further, the ASIC module A comprises a first switch S1 and a second switch S2, wherein the first switch S1 and the second switch S2 are arranged and connected in such a way that the voltage U can assume three voltage levels +U, U-ref, or −U. In addition, the ASIC module A comprises two voltage detection units M, wherein the voltage detection units M are arranged between the respective switch S1, S2 and a voltage tap. Alternatively or in addition, a voltage detection unit M can be inserted between the two switches S1, S2 and resistor R.

The two voltage taps can be used, for example, to set a positive and a negative voltage drop between a positive voltage +U and a negative voltage −U. With the setup shown here, the low-pass filter comprising resistors R, Rx and capacitors C, Cx can be tested in such a way.

When the second switch S2 is switched, the voltage U drops from zero volts to a negative value −U. The capacitors C, Cx and the resistors R, Rx reduce a time constant of the voltage drop. This can be detected with the aid of the corresponding voltage detection unit M. The voltage drop can be described according to the following function:

$$U(t) = \pm U(t1) \cdot \exp(-t/(Rx \cdot Cx)).$$

Here Rx denotes the total resistance and Cx the total capacitance of the capacitors. Furthermore, exp denotes the exponential function. The voltage U(t1) corresponds to the first actual voltage value u1 shortly before or during the switching process. Finally, the following applies to the first and second actual voltage values u2, u3:

$$u2 = U(t2) = \pm U(t1) \cdot \exp(-t2/(Rx \cdot Cx))$$

$$u3 = U(t3) = \pm U(t1) \cdot \exp(-t3/(Rx \cdot Cx))$$

Figure 3:
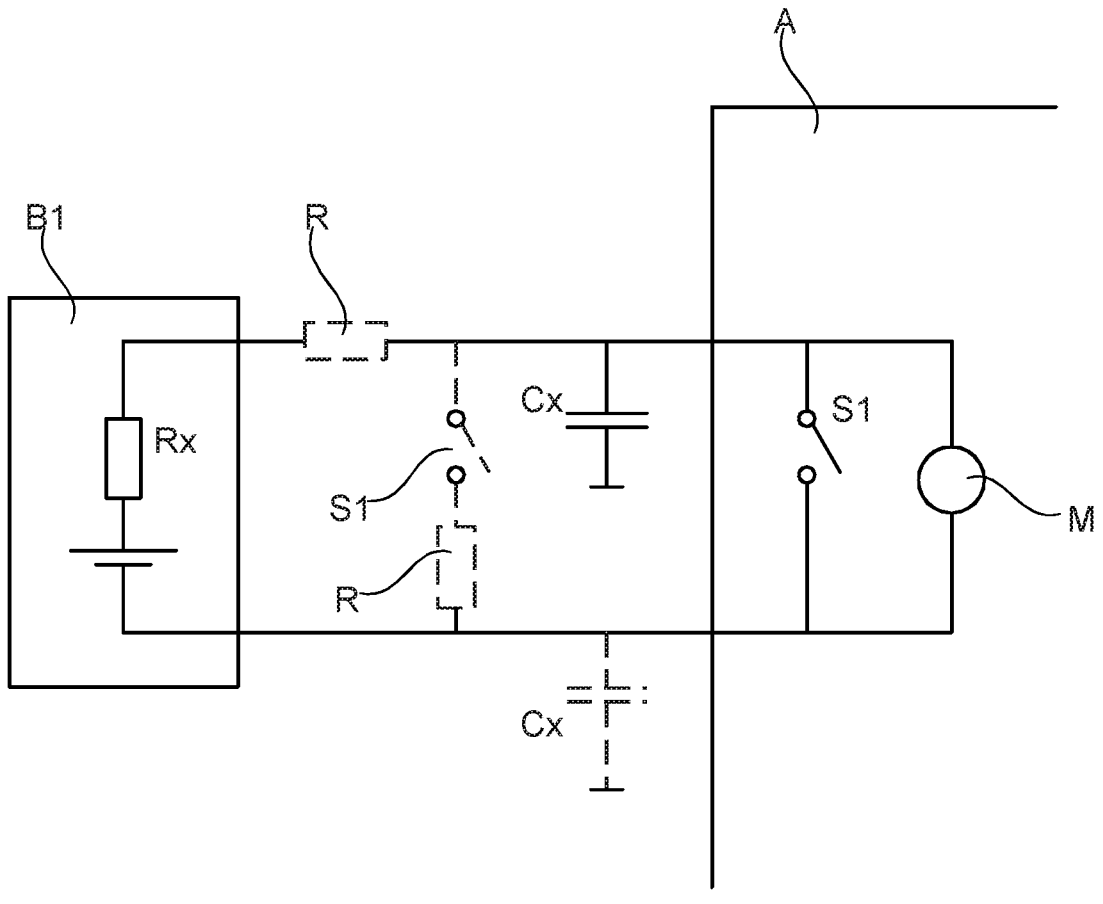
FIG. 3 shows an exemplary apparatus.

FIG. 3 shows a further possible apparatus. The apparatus shown here is used in particular to determine a state of charge of a battery cell B1. As a rule, the (internal) resistance Rx changes when battery cell B1 is charged. An ASIC module is used to provide a voltage U. In addition, ASIC module A comprises a switch S1 and optionally a further resistor R (not shown). The outputs of ASIC module A are each connected to the terminals of battery cell B1. At least one of the connections is grounded via a capacitance Cx. Optionally, both connections can also each be grounded via a capacitance Cx.

By determining the resistance Rx, both the capacitor Cx and the state of charge of battery cell B1 or the battery with the battery cell can be determined. Preferably, the charging process or the discharging process of the respective battery cell B1 can be briefly interrupted.

In a first case, capacitor Cx is assumed to be functional. Then, the voltage drop can be determined before, during the charging process of battery cell B1 and/or after the charging process of battery cell B1.

Figure 4:
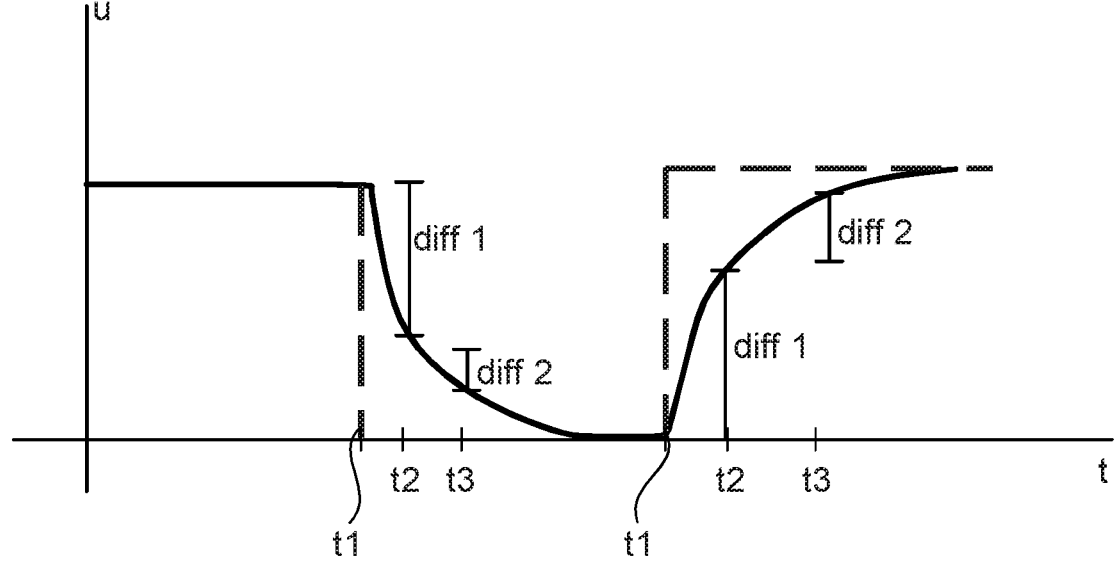
FIG. 4 shows a voltage curve.

FIG. 4 shows a voltage curve. The voltage curve shows the course of a voltage u as a function of time t. The voltage curve is switched to a second setpoint voltage value u2 at a first point in time t1 by a switching operation at the first point in time t1. Due to the low-pass filter, there is a slowed-down decrease of the voltage U as a function of time t. At a later time, for example, about 10 milliseconds after the switching operation, a further switching operation switches the second setpoint voltage value to the first setpoint voltage value. Shown is the voltage U detected with the aid of the voltage detection unit M as a function of time t.

For a better differentiation, the setpoint voltage values are shown dashed. In contrast, the time course of the actual voltage is shown as a solid line.

Before the switching operation, a first actual voltage value u1 is detected at a first point in time t1 with the aid of the voltage detection unit M.

At a second point in time t2 after the switching operation, a second actual voltage value u2 is detected with the aid of the voltage detection unit M. A first difference diff1 between the first actual voltage value u1 and the second actual voltage value u2 is then determined.

Optionally, a third actual voltage value u3 is detected at a third point in time t3. A second difference diff2 between the second actual voltage value u2 and the third actual voltage value u3 can be determined with the third actual voltage value u3.

A time constant k can be determined in each case with the aid of the first difference diff1 and optionally with the second difference diff2, wherein the time constant k corresponds to the product of the resistance R, Rx, in particular the variable resistance Rx, and the capacitance Cx (of capacitor Cx and optionally of the further capacitor C).

By determining the at least one difference diff1, diff2 it can be determined whether capacitor Cx or the further capacitor C and thus the low-pass filter are functional. Inasmuch as both differences diff1, diff2 are equal to zero, a malfunction of the respective switch S1, S2 can be assumed.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for monitoring a low-pass filter, the low-pass filter comprising at least one resistor and at least one capacitor, the capacitor being connected in parallel with the resistor, a voltage is determined with respect to one side of the capacitor, and the voltage at the capacitor is switchable by at least one switch between a first setpoint voltage value and a second setpoint voltage value, the method comprising:

detecting a first actual voltage value at a first point in time;

performing a switching operation from the first setpoint voltage value to the second setpoint voltage value;

detecting a second actual voltage value at a second point in time, the second point in time being set to be temporally after the switching operation;

determining a first difference of the first and the second actual voltage values; and providing a warning signal if at least the first difference exceeds or falls below a first threshold.

2. The method according to claim 1, wherein a time constant or a time constant of an exponential voltage rise or an exponential voltage drop as a function of time is determined based on the difference, and wherein a state of the resistor and/or the capacitor is determined based on the time constant.

3. The method according to claim 1, wherein the first point in time is set to be immediately before or during the switching operation and the further point in time is set to be one time constant after the first point in time.

4. The method according to claim 1, wherein the resistor is variable.

5. The method according to claim 1, wherein additionally a third actual voltage value is determined at a third point in time, wherein the third point in time is set to be after the second point in time, wherein a first difference between the first actual voltage value and the second actual voltage value is determined, wherein a second difference between the second actual voltage value and the third actual voltage value is determined, and wherein the warning signal is provided insofar as the first difference and/or the second difference fall below or exceed the threshold.

6. The method according to claim 1, wherein the resistance is an internal resistance of a battery cell.

7. The method according to claim 1, wherein a further switching operation takes place after the second point in time, wherein the further switching operation switches the voltage from the second setpoint voltage value to the first setpoint voltage value, wherein after the further switching operation a detection of the respective actual voltage value takes place, and wherein the respective difference is determined from the respective actual voltage values.

8. The method according to claim 1, wherein the determination of the voltage values takes placed during a production test of a battery management system or a voltage detection unit or during an end-of-line test.

9. An apparatus for monitoring a low-pass filter, the low-pass filter being associated with at least one battery cell, the low-pass filter comprising a capacitor and a resistor, the apparatus comprising at least one switch and a voltage detection unit to determine voltage values at the capacitor, wherein the apparatus is designed to carry out the method according to claim 1.

10. The apparatus according to claim 9, further comprising an ASIC module, wherein the ASIC module comprises the at least one switch and the voltage detection unit.

11. A battery management system for at least one battery cell, comprising the apparatus according to claim 9.

12. A battery for a vehicle, comprising a battery management system according to claim 11.

13. A vehicle comprising an apparatus according to claim 9.

* * * * *